US008392000B2

(12) United States Patent
Levin et al.

(10) Patent No.: US 8,392,000 B2
(45) Date of Patent: Mar. 5, 2013

(54) ADAPTIVE NOTCH FILTER

(75) Inventors: Jason Levin, Solana Beach, CA (US); Petros Ioannou, Palos Verdes Estates, CA (US)

(73) Assignee: University of Southern California, Los Angeles, CA (US)

( * ) Notice: Subject to any disclaimer, the term of this patent is extended or adjusted under 35 U.S.C. 154(b) by 236 days.

(21) Appl. No.: 12/795,273

(22) Filed: Jun. 7, 2010

(65) Prior Publication Data

US 2010/0312365 A1 Dec. 9, 2010

Related U.S. Application Data

(60) Provisional application No. 61/184,583, filed on Jun. 5, 2009.

(51) Int. Cl.
*G06F 19/00* (2011.01)
(52) U.S. Cl. .......................................... 700/37; 455/73
(58) Field of Classification Search .............. 700/37–40; 333/175–176; 455/73, 78; 244/174, 177
See application file for complete search history.

(56) References Cited

U.S. PATENT DOCUMENTS

| | | | | | |
|---|---|---|---|---|---|
| 4,195,265 | A | * | 3/1980 | Vali | 327/556 |
| 5,325,247 | A | * | 6/1994 | Ehrlich et al. | 360/78.09 |
| 5,331,299 | A | * | 7/1994 | Smith | 333/175 |
| 5,960,091 | A | * | 9/1999 | White et al. | 381/98 |
| 6,052,252 | A | * | 4/2000 | Kim | 360/78.09 |
| 6,351,740 | B1 | * | 2/2002 | Rabinowitz | 706/22 |
| 6,611,602 | B1 | * | 8/2003 | White et al. | 381/98 |
| 2004/0179387 | A1 | * | 9/2004 | Abraham | 365/145 |
| 2005/0207585 | A1 | * | 9/2005 | Christoph | 381/71.11 |

OTHER PUBLICATIONS

Kim et al., An adaptive notch filter for suppressing mechanical resonce in high track density disk drives, May 19, 2005, Microsyst Technol, p. 638-652.*
Kharisov et al., L1 Adaptive control Low for Fexable Space Launch Vehicle and Proposed Plan for Flight Test Validation, Aug. 18-21, 2008, ALAA guidance Navigation and control Conference and Exhibit, p. 1-20.*
Adami, T.M. et al. 2003. Time-varying notch filters for control of flexible structures and vehicles. AIAA/IEEE Digital Avionics Systems Conference, Indianapolis, IN, Oct. 2003, pp. 7.C.2-1 to 7.C.2.6.

(Continued)

*Primary Examiner* — Kidest Bahta
(74) *Attorney, Agent, or Firm* — McDermott Will & Emery LLP

(57) ABSTRACT

The control of flexible systems is often difficult due to the exact frequencies of the elastic modes being hard to identify. These flexible modes may change over time, or vary between units of the same system. The variation in the modal dynamics may cause a degradation in performance or even instabilities unless compensated for by the control scheme. Controllers designed for these types of systems use notch filters for mode suppression. However variation in the parameters of the flexible modes may cause the need for wide notch filters. An adaptive scheme is proposed which uses an online estimator based on plant parameterization. The scheme may not use probe signals and may not rely on exact parameter identification of the unknown parameters. Instead it may continuously update itself to cancel the effect of the flexible modes by been able to identify the effect of the modal dynamics on the performance of the system. The adaptive notch filter can be designed narrower, adding less phase lag at lower frequencies, thereby allowing an increase in bandwidth and disturbance rejection capability. Simulation and experimental verification of the adaptive mode suppression scheme is given through the use of a laser beam pointing system. The adaptive scheme is compared to a non-adaptive scheme, and is able to decrease the standard deviation of the experimentally measured tracking error by 14% even when the flexible dynamics are unknown.

20 Claims, 14 Drawing Sheets

OTHER PUBLICATIONS

Dragosevic, M.V. et al. 1995. An adaptive notch filter with improved tracking properties. IEEE Trans. Signal Processing, Sep. 1995, vol. 32, No. 9, pp. 2068-2078.

Englehart, M.J. et al. 1992. An adaptive control concept for flexible launch vehicles, presented at the AIAA Guid., Nav. Control Conf., Hilton Head, SC, Aug. 1992.

Ioannou, P. et al. 2006. Adaptive Control Tutorial, Chapter 4, "On-Line Parameter Estimation." Philadelphia PA: SIAM, pp. 144-249.

Levin, J. et al. 2008. Multirate adaptive notch filter with an adaptive bandwidth controller for disk drives. In 2008 American Control Conference Proceedings, Westin Seattle Hotel, Seattle, WA, Jun. 11-13, 2008, pp. 4407-4412.

Levin, J. et al. 2008. Adaptive mode suppression scheme for an aeroelastic airbreathing hypersonic cruise vehicle. In AIAA Guid., Nav. Control Conference, Honolulu, HI, Aug. 2008, 12 pages.

Levin. J. et al. 2009. Adaptive mode-suppression and disturbance-rejection scheme with application to disk drives. IEEE Transactions on Control Systems Technology, May 2009, vol. 17, No. 3, pp. 620-632.

Lim, T.W. et al. 1997. Adaptive filters for real-time system identification and control. Journal of Guidance, Control, and Dynamics, Jan.-Feb. 1997, vol. 20, No. 1, pp. 61-66.

Mehra, R.K. et al. 2000. On-line identification, flutter testing and adaptive notching of structural mode parameters for V-22 tiltrotor aircraft. Sadhana, Apr. 2000, vol. 25, Part 2, pp. 137-158.

Mehra, R.K. et al. 2004. Time-domain system identification methods for aeromechanical and aircraft structural modeling. Journal of Aircraft, Jul.-Aug. 2004, vol. 41, No. 4., pp. 721-729.

Ohno, K. et al. 2006. Adaptive resonant mode compensation for hard disk drives. IEEE Trans. Ind. Eng., Apr. 2006, vol. 53, No. 2, pp. 624-630.

Ra, W.S. 2005. Practical adaptive notch filter for missing bending mode rejection. Electronics Letters, Mar. 3, 2005., vol. 41, No. 5, 2 pages.

Regalia, P.A. 1991. An improved lattice-based adaptive IIR notch filter. IEEE Transactions on Signal Processing, Sep. 1991, vol. 39, No. 9, pp. 2124-2128.

Travassos-Romano, J.M. et al. 1988. Fast least square adaptive notch filtering. IEEE Transactions Acoustics, Speech, Signal Processing, Sep. 1988, vol. 36, No. 9, pp. 1536-1540.

\* cited by examiner

ADAPTIVE NOTCH FILTER

CROSS-REFERENCE TO RELATED APPLICATION

This application is based upon and claims priority to U.S. Provisional Patent Application 61/184,583, entitled "ADAPTIVE NOTCH FILTER FOR FEEDBACK CONTROL SYSTEMS," filed Jun. 5, 2009. The entire content of this application is incorporated herein by reference.

STATEMENT REGARDING FEDERALLY SPONSORED RESEARCH

This invention has been made with government support under Contract No. CMS-0510921, awarded by the National Science Foundation. The government has certain rights in the invention.

BACKGROUND

1. Technical Field

This disclosure relates to feedback control systems for flexible mechanical systems which suppress modal frequencies in a control signal.

2. Description of Related Art

Flexible dynamics can occur in numerous mechanical systems in which control systems seek to maintain stability or increase tracking performance. Unless accounted for by the control scheme, these dynamics can cause instabilities or degradation in performance.

A notch filter has been used to suppress the flexible modes. However, the modal frequencies may be unknown and may even vary over time. This has been dealt with by using a notch wide enough to encompass these variations. Such an approach, however, may degrade performance.

One such system is a pointing system using flexible actuators. As the notch filter becomes wider, however, it may induce greater magnitude and phase lag at lower frequencies, resulting in a lower bandwidth system.

Another approach has been to use an adaptive notch filter. This is a notch filter whose center frequency varies to track the modal frequencies of the system. The adaptive notch filter has been studied in signal processing research, see J. M. T Romano and M. Bellanger, "*Fast least square adaptive notch filtering,*" IEEE Trans. Acoust., Speech, Signal Process., vol. 36, no. 9, pp. 1536-1540, September 1988; P. A. Regalia, "*An improved lattice-based adaptive IIR notch filter,*" IEEE Trans. Acoust., Speech, Signal Process., vol. 39, no. 9, pp. 2124-2128, September 1991; and M. V. Dragosevic and S. S. Stankovic, "*An adaptive notch filter with improved tracking properties,*" IEEE Trans. Signal Process., vol. 43, no. 9, pp. 2068-2078, September 1995 as well as in applications such as a hard disk drive, see K. Ohno and T. Hara, "*Adaptive resonant mode compensation for hard disk drives,*" IEEE Trans. Ind. Eng., vol. 53, no. 2, pp. 624-630, April 2006, launch vehicles, see M. J. Englehart and J. M. Krauss, "*An adaptive control concept for flexible launch vehicles,*" presented at the AIAA Guid., Nav. Control Conf., Hilton Head, S.C., August 1992, aircraft, see R. K. Mehra and R. K. Prasanth, "*Time-domain system identification methods for aeromechanical and aircraft structural modeling,*" J. Aircraft, vol. 41, no. 4, pp. 721-729, July 2004, and space structures, see T. W. Lim, A. Bosse, and S. Fisher, "*Adaptive filters for real-time system identification and control,*" J. Guid., Control, Dyn., vol. 20, no. 1, pp. 61-66, January 1997.

An adaptive notch filter was used on a model of a booster from the Advanced Launch System (ALS) program. The least squares estimator used a simple un-damped resonator as the model for estimation. However, the resonant mode was very pronounced. In other applications, full plant parameterizations was necessary when the flexible mode was not as significant. A probe signal may also be required which may degrade performance Another strategy for the estimation of the notch filter center frequency uses frequency weighting functions. See K. Ohno and T. Hara, "*Adaptive resonant mode compensation for hard disk drives,*" IEEE Trans. Ind. Eng., vol. 53, no. 2, pp. 624-630, April 2006, The downside may be that there are several failure modes that are known and avoidance requires some modal information a priori.

A stochastic state space algorithm for mode frequency estimation has also been proposed. See R. K. Mehra and R. K. Prasanth, "*Time-domain system identification methods for aeromechanical and aircraft structural modeling,*" J. Aircraft, vol. 41, no. 4, pp. 721-729, July 2004, However, it relied on the injection of a probe signal. An indirect adaptive compensation (IAC) scheme also required a probe signal to complete the estimation. An adaptive mode suppression scheme may use a Least mean squares (LMS) algorithm to update filter coefficients and the modal parameters may then be extracted from the filter. See T. W. Lim, A. Bosse, and S. Fisher, "*Adaptive filters for real-time system identification and control,*" J. Guid., Control, Dyn., vol. 20, no. 1, pp. 61-66, January 1997, These approaches may either require the injection of an additional signal for parameter identification or may not update the adaptive notch filter in real-time. These drawbacks may not allow them to function efficiently on a variety of system.

SUMMARY

A plant may have a flexible mode with a modal frequency. The plant may be driven by a control signal as part of a feedback control system. The feedback control system may include an adaptive notch filter configured to substantially suppress the modal frequency from the control signal. The adaptive notch filter may be configured such that its notch frequency is governed by a tuning signal. An online estimator may be configured to estimate the modal frequency of the flexible mode in the plant in real time based on the dynamic response of the plant to the control signal and to generate the tuning signal based on the estimate of the modal frequency.

The subsystem may include a rigid body controller configured to generate a control signal that would tightly control the plant if the plant did not have the flexible mode at the modal frequency.

The adaptive notch filter may have a bandwidth which is less than 125 percent of the bandwidth of the inverse of the flexible mode of the plant.

The configuration of the online estimator may be such as to not generate a substantially erroneous estimate of the modal frequency, even in response to a disturbance at a magnitude which causes the feedback control system to become unstable.

The adaptive notch filter and the online estimator may be contained within a single integrated chip.

The tuning signal may not be based on the results of a probe signal injected into the plant, separate from the control signal.

The online estimator may be configured to repeatedly update the determined modal frequency of the flexible mode in the plant based on the dynamic response of the plant to the control signal. The online estimator may be configured to repeatedly update the tuning signal based on the repeated updated determined modal frequency of the flexible mode in the plant.

A signal-controlled plant may include a plant having a flexible mode with a modal frequency. The signal-controlled plant may include a feedback control system of any of the types summarized above. The controlled plant may, for example, be a hard disk drive, an aircraft, a launch vehicle, or a camera.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings disclose illustrative embodiments. They do not set forth all embodiments. Other embodiments may be used in addition or instead. Details which may be apparent or unnecessary may be omitted to save space or for more effective illustration. Conversely, some embodiments may be practiced without all of the details which are disclosed. When the same numeral appears in different drawings, it refers to the same or like components or steps.

DETAILED DESCRIPTION OF ILLUSTRATIVE EMBODIMENTS

Figure 1:
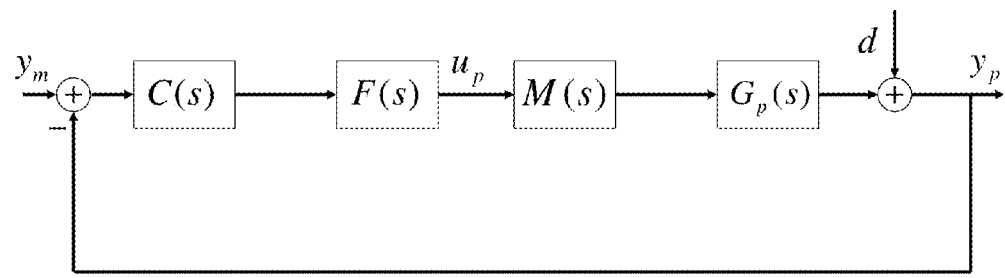
FIG. 1 is a diagram of a feedback system for mode suppression schemes.

Illustrative embodiments are now discussed. Other embodiments may be used in addition or instead. Details which may be apparent or unnecessary may be omitted to save space or for a more effective presentation. Conversely, some embodiments may be practiced without all of the details which are disclosed.

A feedback control scheme may make use of an adaptive notch filter. The adaptive notch filter may be designed to suppress the modal dynamics of the system while working in harmony with another controller designed for the rigid system, that is the system without the flexible modes. This second controller, called the rigid-body controller, may be designed using a variety of methods, since the elastic dynamics may be, for the most part, neglected in the design. The rigid body controller may be added to control the plant. The rigid body controller may be any other system generating a control signal for the plant.

The interaction of the rigid-body control and adaptive notch filter may be configured to ensure stability of the closed-loop adaptive system. The design of each component may be done in a more separated method. It therefore may be useful for systems where the modes are not precisely known early in the control design process or for systems where the modal parameters vary between production units.

The scheme presented herein does not need persistent excitation or a probe signal. A design procedure for an adaptive notch filter scheme is given to serve as an example. Other approaches may be used instead.

To showcase the ability of the adaptive notch filter to work in a real-time control system, a laser-beam pointing experiment of the type described in N. O. Pérez-Arancibia, J. S. Gibson, and T.-C. Tsao, "*Frequency-weighted minimum-variance adaptive control of laser beam jitter*," IEEE/ASME Trans. Mechatron., vol. 14, no. 3, pp. 337-348, June 2009 has been used. In this experiment, the plant may contain a single lightly damped complex pole. This type of system may be prevalent in mechanical systems which, by design, may have a flat response below the bandwidth of the elastic modes.

The adaptive notch filter may enable a higher bandwidth control system with better performance in terms of disturbance rejection capabilities, such as the rigid body controller discussed above. Other methods of rigid-body control with an adaptive notch filter of this type may include a linear quadratic regulator (LQR) controller for aircraft control, see J. Levin, P. Ioannou, and M. Mirmirani, "*Adaptive mode suppression scheme for an aeroelastic airbreathing hypersonic cruise vehicle*," presented at the AIAA Guid., Nav. Control Conf., Honolulu, Hi., August 2008, and a classical phase lead design for an HDD, see J. Levin and P. Ioannou, "*Adaptive mode suppression and disturbance rejection scheme with application to disk drives*," IEEE Trans. Control Syst. Technol., vol. 17, no. 3, pp. 620-632, May 2009. F. Franklin, J. Powell, and M. Workman, Digital Control of Dynamic Systems. Boston, Mass.: Addison-Wesley, 1990.

A general adaptive notch filter control scheme is given below, followed by a control design for a single complex pole, and then simulations and experiments of a design are discussed. Conclusions are then drawn.

General Adaptive Notch Filter

A plant may have a rigid component with no flexible modes, as well as a flexible component with unknown lightly damped flexible modes, and contain pairs of complex poles. A controller may be designed to achieve good performance in the presence of disturbances, which may mean shaping the sensitivity and complementary sensitivity functions appropriately. The control objective may include tracking a certain class of reference signal $y_m \in \mathcal{L}_\infty$ by using the internal model principle. So the controller may be designed to include $Q_m(s)$, which may be an internal model of $y_m$ and may be a known monic polynomial of degree q with all roots in $\Re[s] \leq 0$ and with no repeated roots on the j$\omega$-axis. The plant may take the form $$y_p = G_p(s)M(s)u_p + d = \frac{Z_p(s)}{R_p(s)} \frac{Z_m(s)}{R_m(s)} u_p + d \qquad (1)$$

where $Z_m(s)/R_m(s)$ represent the flexible modes of the plant, $Z_p/R_p(s)$ is the non-modal part of the plant, and d is a bounded output disturbance.

The flexible part of the plant may take the form $$\frac{Z_m(s)}{R_m(s)} = \frac{\omega_d^2}{s^2 + 2\zeta\omega_d s + \omega_d^2} \qquad (2)$$

where $\zeta > 0$ is the damping and $\omega_d > 0$ is the natural frequency of the mode. It is assumed that the order of $R_p(s)$ is n, and since the concern is with suppressing the flexible modes, the non-modal part of the plant $G_p(s) = Z_p(s)/R_p(s)$ may be stabilizable so a rigid-body controller, later denoted as C(s), can be designed for the rigid system. Equation (2) is used for illustration purposes and can be extended to higher order modes too.

Known Parameter Case

The control scheme may include a narrow adaptive notch filter centered at the natural frequency of the flexible pole in equation (1) above. A compensator may be designed by using any design technique while, for the most part, completely neglecting the flexible dynamics. A controller may be designed which includes an internal model $Q_m(s)$. However this may not be necessary for the adaptive notch filter to function properly. The control problem is discussed in this format merely for clarity of presentation.

FIG. 1 is diagram of a feedback system for mode suppression schemes. The control loop is seen in FIG. 1. The input may be $$u_p = -F(s)C(s)(y_p - y_m) \qquad (3)$$

$$C(s) = \frac{P(s)}{Q_m(s)L(s)} \qquad (4)$$

$$F(s) = \frac{Z_f(s)}{R_f(s)}. \qquad (5)$$

The rigid-body controller C(s) may be assumed to be proper and realizable and is designed such that the polynomial equation $$L(s)Q_m(s)R_p(s) + P(s)Z_p(s) = A(s) \qquad (6)$$

gives a Hurwitz A(s), which may be the desired closed-loop poles when the flexible dynamics and notch filter are neglected.

The filter F(s) in (3) may be $$\frac{Z_f(s)}{R_f(s)} = \frac{s^2 + 2\zeta_z \omega_d s + \omega_d^2}{s^2 + 2\zeta_r \omega_d s + \omega_d^2} \qquad (7)$$

where $\omega_d$ is the same as in (2), $\zeta_z, \zeta_r > 0$, and $\zeta_z < \zeta_r$.

The filter may be designed to fully suppress the flexible mode at the resonant frequency. This may give a condition that must be met $$\left|\frac{Z_m(j\omega)Z_f(j\omega)}{R_m(j\omega)R_f(j\omega)}\right| \le k_m \qquad (8)$$

where $k_m$ is the desired margin.

Figure 2:
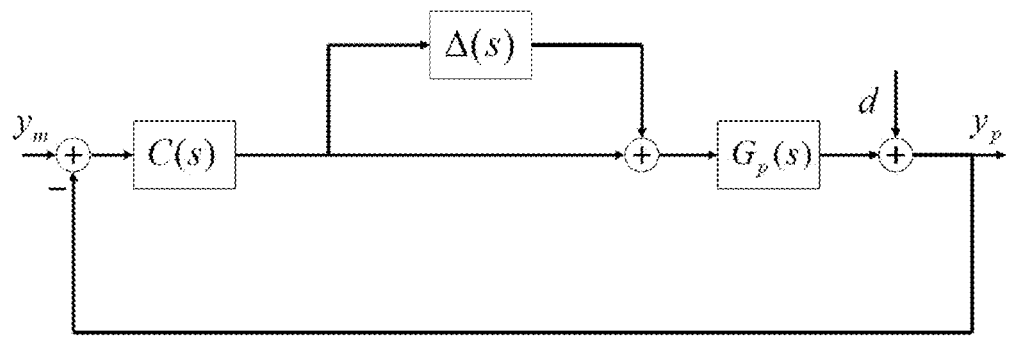
FIG. 2 is a diagram of a feedback system with a notch filter and mode expressed as an uncertainty Ms).

FIG. 2 is a diagram of a feedback system with a notch filter and mode expressed as an uncertainty $\Delta(s)$. The modes and notch filter may be treated as uncertainty, and the disturbance may be ignored. The system may then be put into the form of FIG. 2, whose characteristic equation may be $$1 + C(s)G_p(s)(1 + \Delta(s)) = 0 \qquad (9)$$

which, due to the stable roots of $1 + C(s)G_p(s) = 0$ may imply $$1 + \frac{C(s)G_p(s)}{1 + C(s)G_p(s)} \Delta(s) = 0. \qquad (10)$$

Taking the above equation and substituting in the polynomials and applying the small gain theorem the following must be satisfied:

$$\left\|\frac{P(s)Z_p(s)}{A(s)} \Delta(s)\right\|_\infty < 1 \qquad (11)$$

$$\Delta(s) = F(s)M(s) - 1. \qquad (12)$$

This form of the uncertainty in (12) may be used for ease of the stability proof. The tracking error $e_1 = y_p - y_m$ may be $$e_1 = -\frac{L(s)R_p(s)}{Q_m(s)L(s)R_p(s) + P(s)Z_p(s)(1 + \Delta(s))} Q_m y_m + \qquad (13)$$
$$\frac{L(s)R_p(s)}{Q_m(s)L(s)R_p(s) + P(s)Z_p(s)(1 + \Delta(s))} Q_m d$$

which may be a proper stable transfer function since (11) is satisfied.

This results in $$e_1 = -\frac{L(s)R_p(s)}{Q_m(s)L(s)R_p(s) + P(s)Z_p(s)(1 + \Delta(s))} Q_m d + \varepsilon_t \qquad (14)$$

where $\varepsilon_t$ is a term exponentially decaying to zero.

Therefore the control law may cause $e_1$ to converge exponentially to the set $$D_e = \{e_1 | \|e_1\| \le cd_0\} \qquad (15)$$

where $d_0$ is an upper bound for $|d|$ and $c > 0$ is a constant and to zero if the internal model of the disturbance d is included in $Q_m(s)$.

This result may be for the system when all the parameters are known and the requirement in (11) is met.

Estimation of Plant Parameters

An adaptive mode suppression scheme that may be used when the flexible dynamics are uncertain or changing may now be designed. Starting with the system in (1) there may be $$y_p = \frac{Z_p(s)}{R_p(s)} \frac{Z_m^*(s)}{R_m^*(s)} u_p + d \qquad (16)$$

where $Z_m^*(s)/R_m^*(s)$ is the unknown mode of the plant $$\frac{Z_m^*(s)}{R_m^*(s)} = \frac{w_d^{*2}}{s^2 + 2\zeta^*\omega_d^* s + \omega_d^{*2}} \quad (17)$$

and $Z_p(s)/R_p(s)$ is the known part of the plant. $Z_p(s)$, $R_p(s)$, $Z_m^*(s)$, and $R_m^*(s)$, may follow all the same assumptions made in the known parameter case. The polynomials denoted with the star may be polynomials whose coefficients are the actual values of the real system, which may be treated as unknown. Similarly, the parameters with a star may be the actual parameters of the system.

The parametric model to estimate the unknown modal frequency may be as follows:

$$z = \theta^{*T}\phi + \eta \quad (18)$$

where $\eta$ may be used to represent the disturbance where $$\eta = \frac{R_p(s)R_m^*(s)}{\Lambda_p(s)} d \in \mathcal{L}_\infty \quad (19)$$

$$z = \frac{s^2 R_p(s)}{\Lambda_p(s)} y_p \quad (20)$$

$$\phi = \left[ \frac{-sR_p(s)}{\Lambda_p(s)} y_p \quad \frac{Z_p(s)}{\Lambda_p(s)} u_p - \frac{R_p(s)}{\Lambda_p(s)} y_p \right]^T \quad (21)$$

$$\theta^* = [\, 2\zeta^*\omega_d^* \quad \omega_d^{*2}\,]^T \quad (22)$$

and $\Lambda_p(s)$ is a monic Hurwitz polynomial of degree n+2.

The parametric model in (18) may be achieved by taking (16) and (17), multiplying by a common denominator, collecting unknown terms, and then making proper transfer functions by dividing by a Hurwitz polynomial $\Lambda_p(s)$. The creation of this type of parametric model is well documented, see P. Ioannou and B. Fidan, *Adaptive Control Tutorial*. Philadelphia, Pa.: SIAM, 2006, and the exact representation of the flexible modes in this form may allow for estimation of the unknown modal parameters.

One goal may be to estimate the modal frequency and damping. A wide class of adaptive laws may be used to estimate the unknown parameters, but the gradient algorithm with parameter projection and a deadzone may be adopted and is discussed here.

Let $\phi = [\phi_1, \phi_2]^T$, $\theta = [\theta_1, \theta_2]^T$ and also some a priori known bounds on the damping and natural frequency such that $1 \geq \zeta^u \geq \zeta^* \geq \zeta^l > 0$ and $\omega_d^u \geq \omega_d^* \geq \omega_d^l > 0$ are satisfied. These bounds may be used for projection and may be determined with some knowledge of the actual system and where the parameters may lie. The size of the bounds may only effect the robustness of the design. A deadzone modification may be added to ensure robust adaptation in the presence of the bounded disturbance. The update equations may be $$\dot{\theta}_1 = \begin{cases} \gamma_1(\varepsilon + g)\phi_1, & \text{if } (2\zeta^u \omega_d^u > \theta_1 > 2\zeta^l \omega_d^l) \\ & \text{or } (\theta_1 = 2\zeta^l \omega^l \text{ and } \varepsilon\phi_1 \geq 0) \\ & \text{or } (\theta_1 = 2\zeta^u \omega^u \text{ and } \varepsilon\phi_1 \leq 0) \\ 0, & \text{otherwise} \end{cases} \quad (23)$$

$$\dot{\theta}_2 = \begin{cases} \gamma_2(\varepsilon + g)\phi_2, & \text{if } ((\omega_d^u)^2 > \theta_2 > (\omega_d^l)^2) \\ & \text{or } (\theta_2 = (\omega^l)^2 \text{ and } \varepsilon\phi_2 \geq 0) \\ & \text{or } (\theta_2 = (\omega^u)^2 \text{ and } \varepsilon\phi_2 \leq 0) \\ 0, & \text{otherwise} \end{cases} \quad (24)$$

where $$\varepsilon = \frac{z - \theta^T \phi}{m_s^2} \quad (25)$$

$$m_s^2 = 1 + \phi^T \phi. \quad (26)$$

$$g = \begin{cases} 0, & \text{if } |\varepsilon m_s| > g_0 \\ -\varepsilon, & \text{if } |\varepsilon m_s| \leq g_0. \end{cases} \quad (27)$$

In the above equations, the overdot may represent the differential operator and the bounds may be constants determined a priori, and may also be design parameters chosen a priori.

The deadzone may ensure that adaptation stops when the estimation error is below the level of the disturbance, so that only good information is used to update the parameters.

The above estimation law may guarantee the following:

1) $\theta \in \mathcal{L}_\infty$;
2) $\varepsilon, \varepsilon m_s, \theta \in S(g_0 + \eta^2/m_s^2)$;
3) $\dot\theta \in \mathcal{L}_1 \cap \mathcal{L}_2$;
4) $\lim_{t \to \infty} \dot\theta(t) = \bar{0}$, where $\bar{0}$ is a constant vector Adaptive Control Law The adaptive control law may be formed by replacing the notch filter in (3), which may have the form of (7), with an adaptive notch filter. The online estimates used in the adaptive notch filter may come from the online estimator and may be $$\theta = [2\hat{\zeta}_d \hat{\omega}_d, \hat{\omega}_d^2]^T. \quad (28)$$

The adaptive control law may become $$u_p = -\frac{\hat{Z}_f(s)}{\hat{R}_f(s)} \frac{P(s)}{L(s)Q_m(s)}(y_p - y_m). \quad (29)$$

In the above control law, the notch filter $\hat{Z}_f(s)/\hat{R}_f(s)$ may be designed to cancel the unknown mode of the plant. Denoting the polynomials with a hat indicates that the coefficients may be time-varying estimates which may come from the online estimator. This may be done by using the estimate of the modal frequency as the center frequency, thereby making it an adaptive notch filter.

The filter may become $$\frac{\hat{Z}_f(s)}{\hat{R}_f(s)} = \frac{s^2 + 2\zeta_z \hat{\omega}_d s + \hat{\omega}_d^2}{s^2 + 2\zeta_r \hat{\omega}_d s + \hat{\omega}_d^2} \quad (30)$$

where $\omega_d$ may be the estimate of the modal frequency and the damping ratios may be set a priori using equation (8) as a reference.

Equation (11) may be satisfied at every frozen time. This may lead to $$\left\|\frac{P(s)Z_p(s)}{A^*(s)} \cdot \Delta(s, \theta)\right\|_\infty < 1 \quad (31)$$

$$\Delta(s, \theta) = \hat{F}(s, \theta) \cdot \hat{M}(s, \theta) - 1. \quad (32)$$

Frozen time refers to the time-varying coefficients of the polynomials being treated as constants when two polynomials are multiplied. Therefore, the controller C(s) may be designed such that (31) is always satisfied. This implies a priori knowledge of the bounds on the unknown parameters which may lead to a convex set $\theta \in S$, that the estimator may use for projection. These bounds, through the updating of the parameters in the adaptive notch filter, may create a convex set of possible $\Delta(s, \theta)$ which may be used to obtain a weight used for control design.

$\bar{F}(s, \theta), \bar{M}(s, \theta)$ may be denoted as the frozen time versions of the systems $\hat{F}(s, \theta), \hat{M}(s, \theta)$. That is to say, the overbar versions may have estimated parameters that come from the set but are frozen in time, and therefore are treated as LTI systems.

Thus $$l(\omega) = \max_{\theta \in S} |\bar{F}(j\omega, \theta)\bar{M}(j\omega, \theta) - 1| \quad (33)$$

and a rational transfer function weight $$|W(j\omega)| \geq l(\omega), \forall \omega. \quad (34)$$

This weight can be substituted in (31) to acquire the LTI stability requirement as $$\left\|\frac{C(s)G_p(s)}{1 + C(s)G_p(s)} W(s)\right\| = \left\|\frac{P(s)Z_p(s)}{A^*(s)} W(s)\right\|_\infty < 1. \quad (35)$$

This requirement for stability can be achieved offline from knowledge of the parameter bounds and the adaptive notch filter design. The boundedness of the parameters as well as convergence of the error signal may be zero. However there is no guarantee that the estimated parameters will converge to the true values, as this may not be needed for stability. What may be required for stability may be that the gain of $\hat{F}(s, \theta)$, $\hat{M}(s, \theta)$ remains close to 1 which does not necessarily imply parameter convergence. However, if the reference signal contains significant persistent excitation (PE), see P. Ioannou and B. Fidan, *Adaptive Control Tutorial*. Philadelphia, Pa.: SIAM, 2006, then the estimates may converge to the true values. In other words, the parameters may adapt to bring the error signal close to zero, at which point the deadzone modification may halt adaptation, thereby freezing the estimates which may not be at the true value.

Control Design

Figure 3:
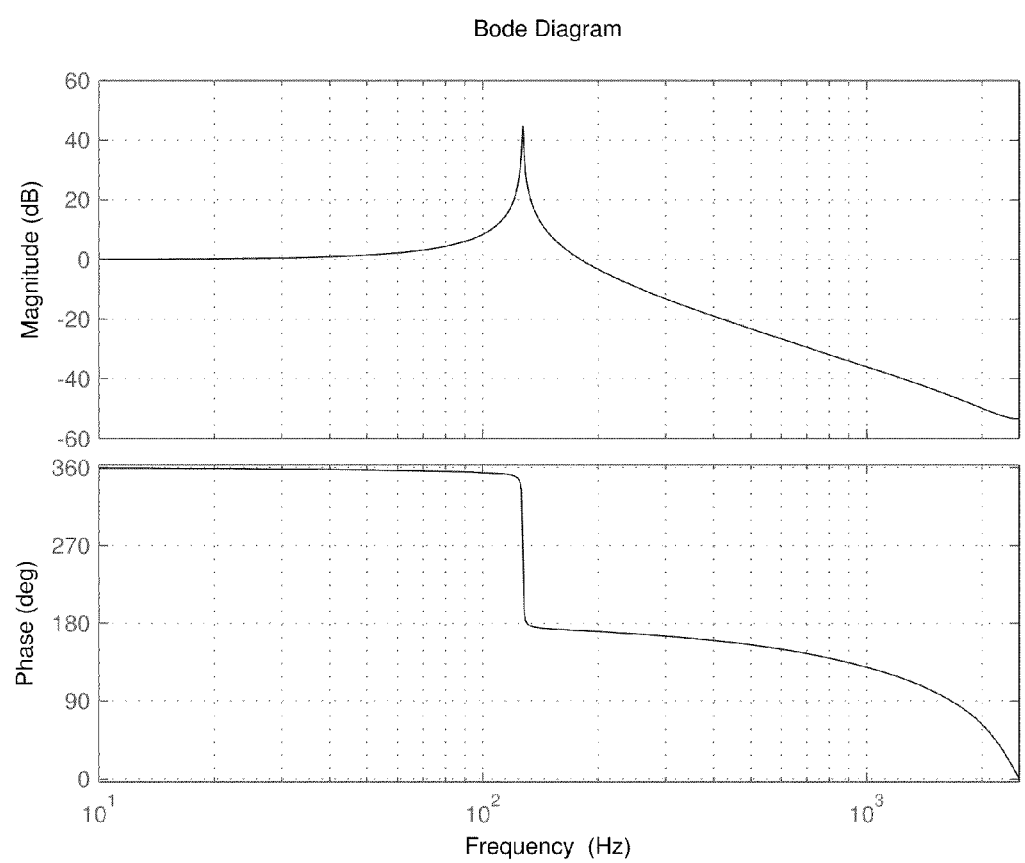
FIG. 3 illustrates a bode plot of an open loop plant.

FIG. 3 illustrates a bode plot of an open loop plant.

The adaptive notch filter scheme may now be designed for a system with a single complex pole, which may be representative of mechanical systems with a flat frequency response up to the frequency of a lightly damped elastic mode. This type of system may be similar to that of the MEMS fast steering mirror (FSM) which may be used as the actuator in the simulations and experiments described later. For this system, the rigid part of the plant $G_p(s)$ may be unity and the modal part may be as in equation (17) which may lead to a system with bode plots as seen in FIG. 3, including a single decoupled axis of the FSM experimental step.

The control design may be done in the Laplace domain. The controllers may be discretized for implementation on a digital computer. Some fictitious stability and performance requirements may be created to show the benefit of the adaptive mode suppression scheme. A goal may be perfect tracking and elimination of disturbances. The chosen performance metric may be the standard deviation of the tracking error.

Therefore, requirements may be levied on the closed loop sensitivity function which may be a magnitude of at most 55 dB at 1 Hz and a maximum magnitude of 12 dB. A requirement may be added to limit the bandwidth of the closed loop system. This may be necessary for a variety of reasons. In a real implemented system for commercial use, the sampling rate of the feedback error signal may only be slightly faster than the flexible dynamics, and high frequency noise may be present, so a limited bandwidth may be desired. These factors may contribute to a requirement of limiting the closed loop complementary sensitivity to at most 60 dB at 500 Hz with an overall maximum value of 12 dB.

Figure 4:
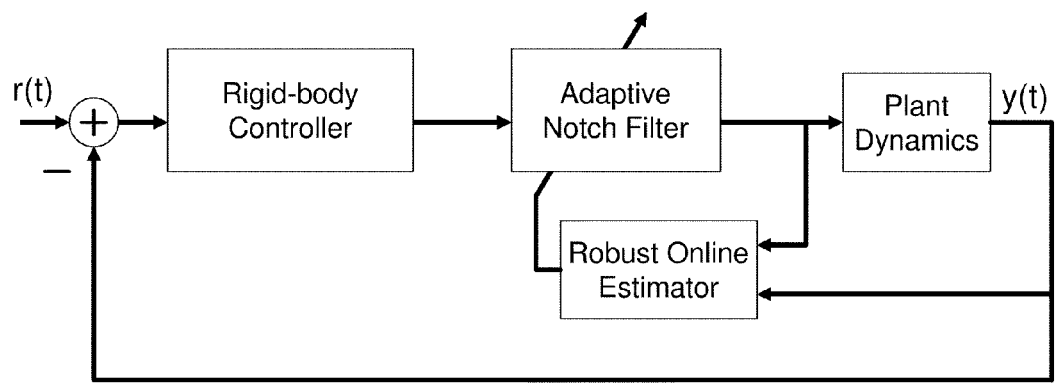
FIG. 4 is a diagram of closed-loop for an experimental setup.

FIG. 4 is a closed-loop diagram for an experimental setup. For the non-adaptive scheme, the adaptive notch filter may be replaced by a fixed notch filter and the online estimator may be removed. Here r(t) may be the reference signal which may be equal to zero and y(t) may be the measured output.

With these requirements in place, two controllers may be designed consistent with the closed loop diagram in FIG. 4. A control scheme utilizing an adaptive notch filter (ANF) and a scheme with a fixed non-adaptive notch filter (NA) may be created. The non-adaptive scheme may utilize a wide notch filter to account for variations in the flexible mode frequency of up to 5% and variations of the damping of up to 5%. This wider notch filter may add phase lag at the lower frequencies and may limit the performance of the system. However the adaptive scheme may have a much narrower notch filter, adding less phase lag and thereby allowing for better disturbance rejection.

Figure 5:
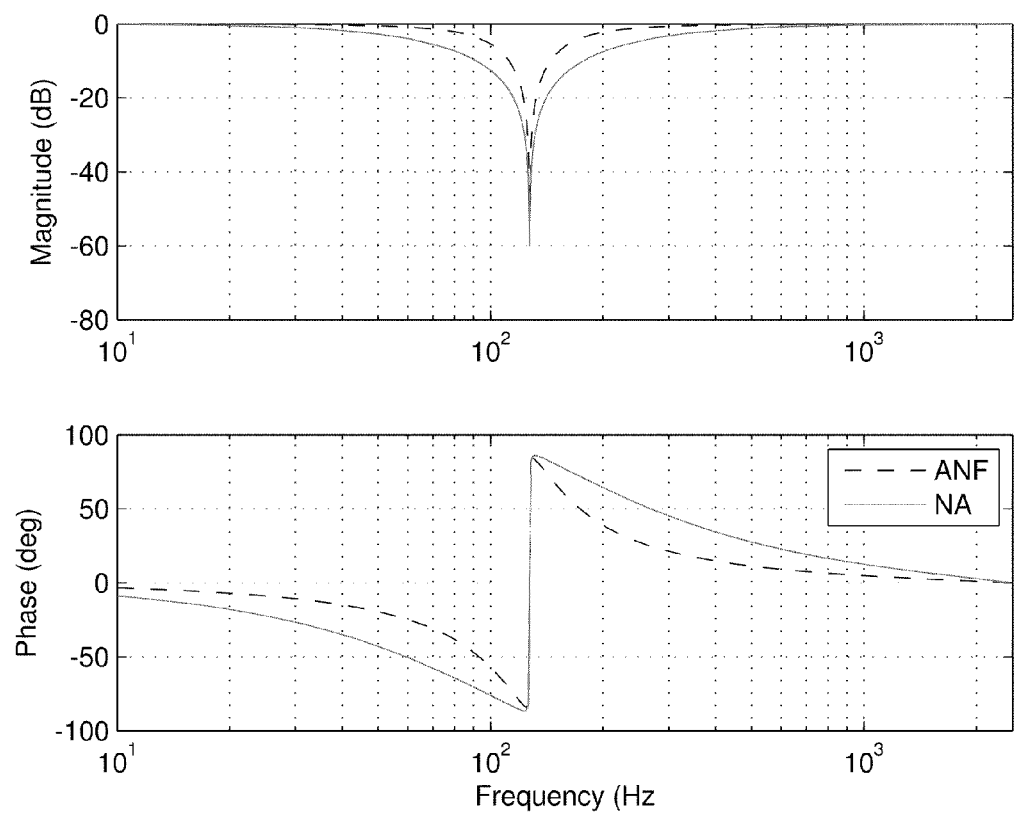
FIG. 5 is a bode plot of notch filters.

FIG. 5 is a bode plot of notch filters. The narrower ANF may add less phase lag than the non-adaptive notch filter (NA). The ANF may be one where the center frequency is frozen at the same value as the non-adaptive notch filter, therefore it may be treated as LTI.

Both of the notch filters are displayed in FIG. 5. The frozen time adaptive notch filter may be $$\bar{F}_A(s, \theta) = \frac{s^2 + 2(9.6 \times 10^{-4})\sqrt{\theta_2}\, s + \theta_2}{s^2 + 2(0.38)\sqrt{\theta_2}\, s + \theta_2} \quad (36)$$

and the non-adaptive notch filter may be $$F_{NA}(s) = \frac{s^2 + 2(1.0 \times 10^{-3})(799.64)s + (799.64)^2}{s^2 + 2(1.0)(799.64)s + (799.64)^2}. \quad (37)$$

To graphically visualize the benefit of the narrower adaptive notch filter, the stability requirement may be used where the notch filter and flexible mode are treated as uncertainties. The unknown parameters may come from the set S, which may be created from the a priori bounds on the unknown parameters. A covering function for both the adaptive and non-adaptive cases may then be devised.

First, for the adaptive case, the filter may be created by using (33) and (34) and the bounds specified by the 5% variation in natural frequency and damping. For this, the adaptive notch filter given in (36) may be used, which may be treated as a frozen time LTI system when θ is constant, and the mode is given by $$\overline{M}(s, \theta) = \frac{\theta_2}{s^2 + \theta_1 s + \theta_2}. \tag{38}$$

For the non-adaptive notch filter case, the filter may be constructed by using $$l_{NA}(\omega) = \max_{\theta \in S} |F_{NA}(j\omega, \theta)\overline{M}(j\omega, \theta) - 1| \tag{39}$$

and then $$|W_{NA}(j\omega)| \geq l_{NA}(\omega), \forall \omega \tag{40}$$

where the subscript is used to denote the non-adaptive scheme.

The stability criteria in (35) may now be used in the form of $$|T(j\omega)| < \left|\frac{1}{W(j\omega)}\right|, \forall \omega \tag{41}$$

where is the complementary sensitivity function.

Figure 6:
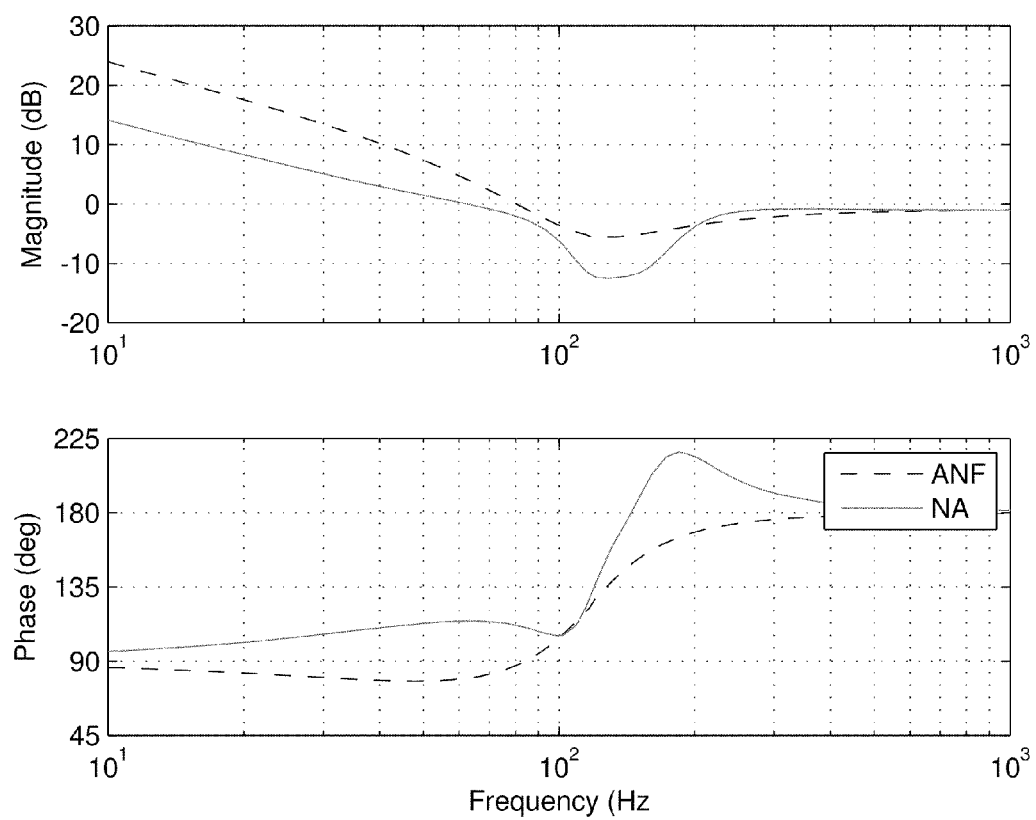
FIG. 6 is a Bode plot of the inverse of filters $W_A(s)$ and $W_{NA}$.

FIG. 6 is a Bode plot of the inverse of filters $W_A(s)$ and $W_{NA}$. The narrower ANF may have a looser constraint on the rigid body control design, when compared to the non-adaptive notch filter (NA).

Plotting the bode plots of the inverse of the filters $W_A(S)$ and $W_{NA}(s)$ in FIG. 6 shows how the adaptive system can allow an increase in bandwidth as well as disturbance rejection.

The adaptive notch filter may deal with a much larger variation in damping since the center frequency may track the flexible mode and suppress the mode. However the suppression capabilities of the fixed non-adaptive notch filter may decrease exponentially as the actual modal frequency of the plant is displaced from the center frequency of the notch filter.

The rigid body controller for the two cases may be slightly different. The adaptive scheme may have a slightly higher gain and faster zeros allowing for an increase in performance while still meeting the requirements. This may be permitted due to the narrower adaptive notch filter. Both rigid body controllers may be designed to maximize performance for the given notch filters in their respective schemes using classical SISO design methodologies. The rigid controllers may be $$C_{ANF}(s) = \frac{129609.0(s + 75.66)^2}{s(s + 635.8)(s + 10.87)(s + 9.86)} \tag{42}$$

$$C_{NA}(s) = \frac{107090.6(s + 61.44)^2}{s(s + 635.8)(s + 10.87)(s + 9.86)} \tag{43}$$

where $C_{ANF}(s)$ may be the rigid controller for the adaptive notch filter scheme and $C_{NA}(s)$ may be the rigid controller for the non-adaptive scheme.

Figure 7:
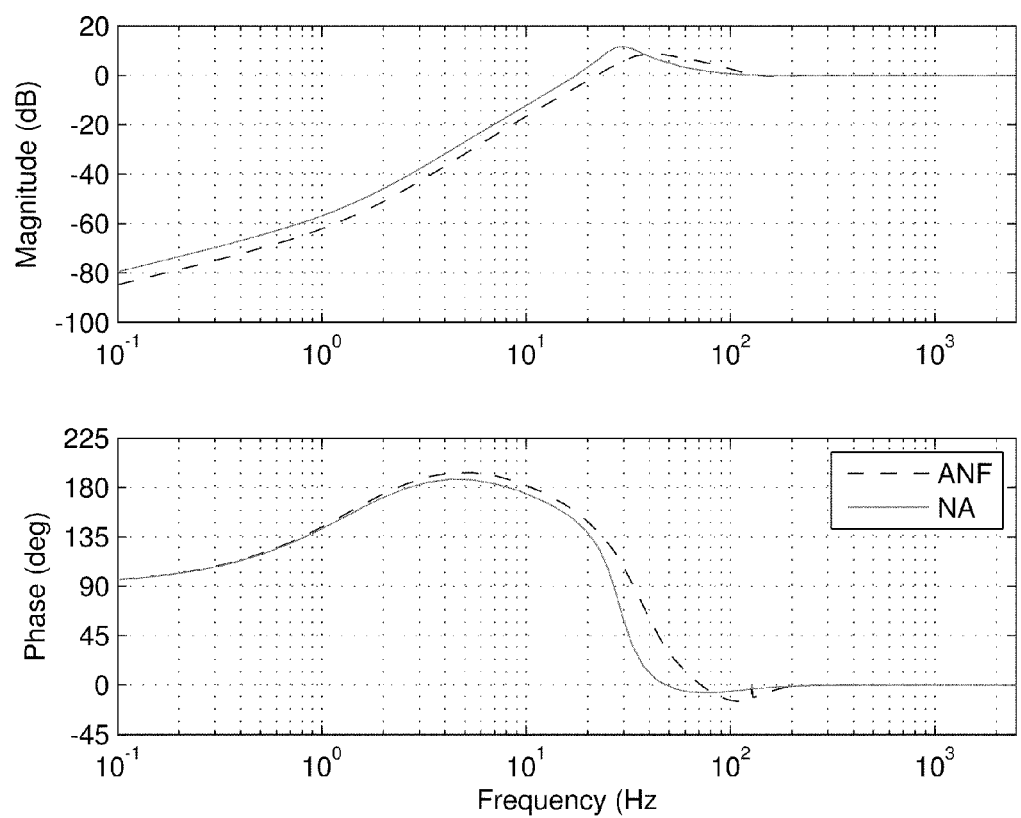
FIG. 7 is a Bode plot of closed-loop sensitivity functions.

FIG. 7 is a Bode plot of closed-loop sensitivity functions. The narrower ANF may allow for better disturbance rejection than the non-adaptive notch filter (NA) due to the increase in bandwidth of the rigid body controller. The ANF may be treated as LTI since the value for the center frequency may be fixed to be the same value used in the non-adaptive notch filter, which may be the nominal plant modal frequency.

The sensitivity functions of each scheme may be seen in FIG. 7 where the disturbance rejection capability of the adaptive scheme may be clear. Since the adaptive notch filter may be narrower than the non-adaptive counterpart, the rigid controller can be designed more aggressively causing the lower magnitude of the sensitivity function. The closed loop bandwidth of the adaptive scheme may also be slightly higher at 65 Hz, as opposed to that of the non-adaptive scheme which may have a bandwidth of 51 Hz, although both schemes may meet the sensitivity and complementary sensitivity function requirements that may have been imposed.

With the controllers and notch filters designed, using the bounds for the unknown parameters, the stability condition of (35) may be checked using $W_A(j\omega)$ and $W_{NA}(j\omega)$ covering filters created earlier. Both schemes may have greater than 7 dB of gain margin. However, to meet the performance requirements and tolerance on the flexible mode, the phase margins may suffer. The non-adaptive scheme may have a phase margin of 18 degrees while in the ideal situation. With the parameters frozen, the adaptive scheme may have a phase margin of 25 degrees. The LTI margins for the adaptive scheme may not be a realistic quantity. However, the margins may be better when a notch filter is narrower.

The online estimator may be designed for the adaptive scheme in the same way presented in the previous section. The $\Lambda_p(s)$ filter may be designed to maximize the signal to noise content of the estimator. This may be done by designing bandpass filters in regions where the flexible modal frequency is thought to occur. The deadzone modification in the estimator may turn off estimation when the estimation error becomes less than some designated preset design value. This may be necessary due to the disturbance signal, which may cause the estimates to drift based on incorrect estimation information.

Simulations and Experiments

Figure 8:
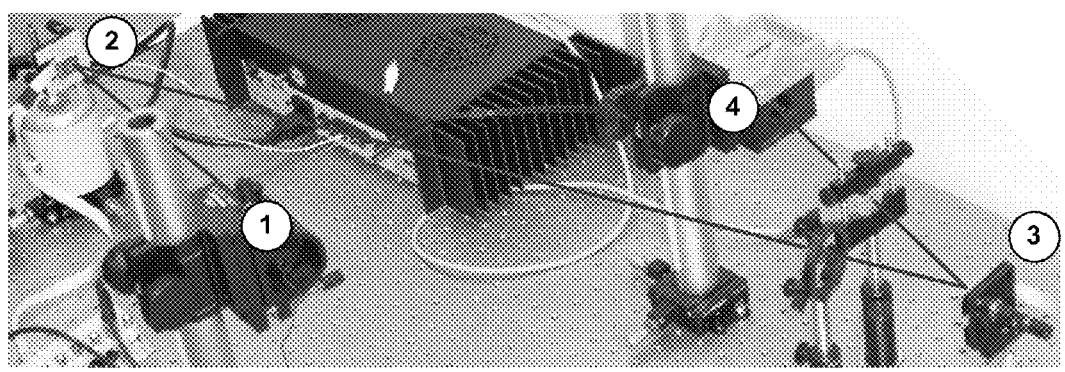
FIG. 8 is a photograph of a laser beam system.

FIG. 8 is a photograph of a laser beam system. The simulations presented in this section use the dynamical models of the laser-beam system shown in FIG. 8. The plant may display a lightly damped flexible mode. Details of the experimental setup in FIG. 8 are described in N. O. Pérez-Arancibia, J. S. Gibson, and T.-C. Tsao, "*Frequency-weighted minimum-variance adaptive control of laser beam jitter*," IEEE/ASME Trans. Mechatron., vol. 14, no. 3, pp. 337-348, June 2009. A brief overview is also given here. As shown in the photograph in FIG. 8, a laser beam leaves the source at position 1, reflects off the fast steering mirror FSM-C at position 2, then reflects off the fast steering mirror FSM-D at position 3 and finally reaches the optical position sensor at position 4. Two lenses may be in the optical path and may focus the beam on FSM-D and the sensor. The mirrors FSM-C and FSM-D may be identical and may be Texas Instruments (TI) MEMS mirrors used in laser communications for commercial and defense applications. FSM-C may be the control actuator, and FSM-D may be used to add disturbance.

The open-loop discrete-time plant of the system may be the transfer function that maps the two-channel digital control command to the sampled two-channel output of the optical position sensor. Thus, the open-loop plant of the system may be the two-input/two-output digital transfer function for the lightly damped fast steering mirror FSM-C with a gain determined by the optical position sensor and the laser path length. Output channels 1 and 2 may represent horizontal and vertical displacements, respectively, of the beam; input channels 1 and 2 may represent commands that drive FSM-C about its vertical and horizontal axes, respectively.

As shown in [10], the two channels of the system may be decoupled, creating two separate SISO systems. Only Channel 1 may be used in the simulations considered here, because the results of this presentation pertain to a single SISO system. A model of Channel 1, identified with a sample-and-hold rate of 5 kHz, is shown in FIG. 3, where the lightly damped flexible mode at 127 Hz may easily be observed.

The magnitude of the frequency response of Channel 1 at 0 Hz may be 0 dB. This may be due to the fact that the transfer function of Channel 1 has been scaled, so that, changes in the distances between the components in optical path in FIG. 8 may not change the models of the system.

A slightly different configuration to the one in FIG. 8, but with the same mirrors FSM-C and FSC-D (i.e., essentially the same dynamics), may be used for the experiments described below. There, the effectiveness of the proposed adaptive mode suppression scheme is demonstrated. In this case, the closed-loop system is run with a sampling-and-hold rate of 5 kHz.

Although the sampling frequency of the system is 5 kHz, a commercial application of the FSM may have a sampling frequency that is significantly smaller, due to time associated with the response of the detector, processing of the detector signal, or calculation of the position error.

The controllers, notch filters, and estimator may all designed in the continuous-time domain. They may be discretized for implementation on the real-time system at the sampling frequency of 5 kHz, since this was the given sampling rate of the system.

Other sample rates were not tested. However a sampling rate much faster than the flexible dynamics of the system may be needed for good performance. This may done using the bilinear transformation on both rigid controllers as well as the estimator filters. The non-adaptive notch filter may be discretized using the matched pole-zero technique. See F. Franklin, J. Powell, and M. Workman, *Digital Control of Dynamic Systems*. Boston, Mass.: Addison-Wesley, 1990.

The adaptive notch filter may be converted to a digital notch filter for use in the real-time system by the following method. Allow $$\omega_f = \tan\left(\frac{\hat{\omega}_d t_s}{2}\right) \quad (44)$$

where $t_s$ is the sampling time.

Then calculate the following values:

$$a_0 = 1 + 2\zeta_T \omega_f + \omega_f^2 \quad (45)$$

$$a_1 = 2\omega_f^2 - 2 \quad (46)$$

$$a_2 = 1 - 2\zeta_T \omega_f + \omega_f^2 \quad (47)$$

$$b_0 = 1 + 2\zeta_z \omega_f + \omega_f^2 \quad (48)$$

$$b_1 = 2\omega_f^2 - 2 \quad (49)$$

$$b_2 = 1 - 2\zeta_z \omega_f + \omega_f^2 \quad (50)$$

and the digital notch filter becomes $$\hat{F}(z) = \left(\frac{a_0 + a_1 + a_2}{b_0 + b_1 + b_2}\right)\frac{b_0 z^2 + b_1 z + b_2}{a_0 z^2 + a_1 z + a_2}. \quad (51)$$

This filter can be implemented in a real-time system in a number of ways. The filter may be placed in a canonical state space form and the states may be updated using the standard discrete state space equations. Both rigid controllers may be discretized using the same method. However, the notch filters may differ only slightly. The method given here for the adaptive notch filter may be very similar to a matched pole-zero technique. Since the sampling frequency may be much faster than the center frequencies of the notch, the discretization method may not play a vital role, but instead may only used for ease of online computation.

Simulations

A series of simulations may be completed using Matlab and Simulink. The goal may be to test the adaptive notch filter scheme before running real-time experiments. The disturbance that may be generated with the second FSM-D in the experiment may be incorporated into the simulation. For the simulations, the reference signal may be a slowly varying 2 Hz sinusoid with an amplitude of 10 V.

The adaptive mode suppression scheme may be compared to the non-adaptive control scheme that was described above. For both simulations the flexible modal frequency may be thought to be at 93% of the nominal value. Therefore, the notch filters may be centered at this incorrect frequency. At this amount of variation in modal frequency, the non-adaptive scheme may be unstable, as the notch filter may only be meant to suppress a variation of up to 5%.

Figure 9:
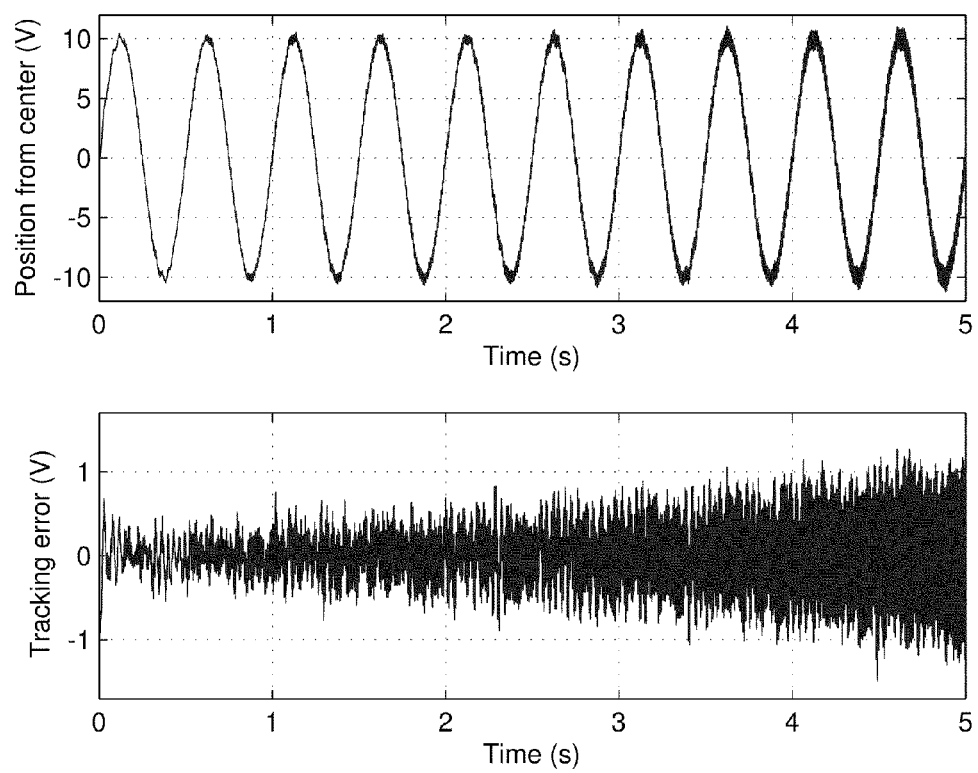
FIG. 9 illustrates simulation results for a non-adaptive scheme when a notch filter is placed at 93% of a plant's modal frequency.

FIG. 9 illustrates simulation results for a non-adaptive scheme when a notch filter is placed at 93% of the plant's modal frequency. The top plot illustrates position output $y_p$; the bottom plot illustrates tracking error (ANF). The time series plots of the output and tracking error are displayed in FIG. 9, where the system may begin to grow unstable as the flexible mode is not adequately suppressed.

Figure 10:
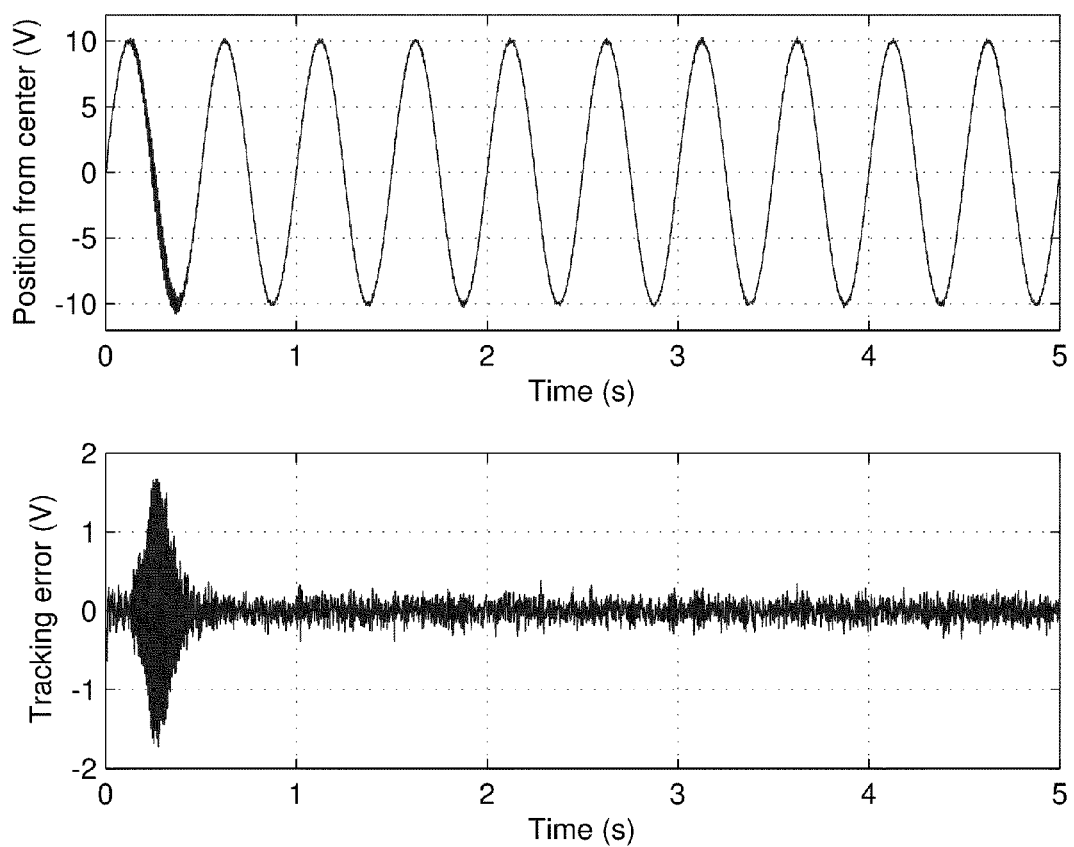
FIG. 10 illustrates simulation results for an adaptive scheme when the initial value of an estimated modal frequency $W_d$ is placed at 93% of a plant's modal frequency.

FIG. 10 illustrates simulation results for an adaptive scheme when the initial value of the estimated modal frequency $\hat{\omega}_d$ is placed at 93% of the plant's modal frequency. The top plot illustrates position output $y_p$. The bottom plot illustrates Tracking error (ANF).

The adaptive scheme's output and tracking error are seen in FIG. 10. Here, the system may display a large tracking error initially as the notch center frequency may be incorrect, but, as adaptation occurs, the notch filter may be able to suppress the mode thereby retaining performance and stability.

Figure 11:
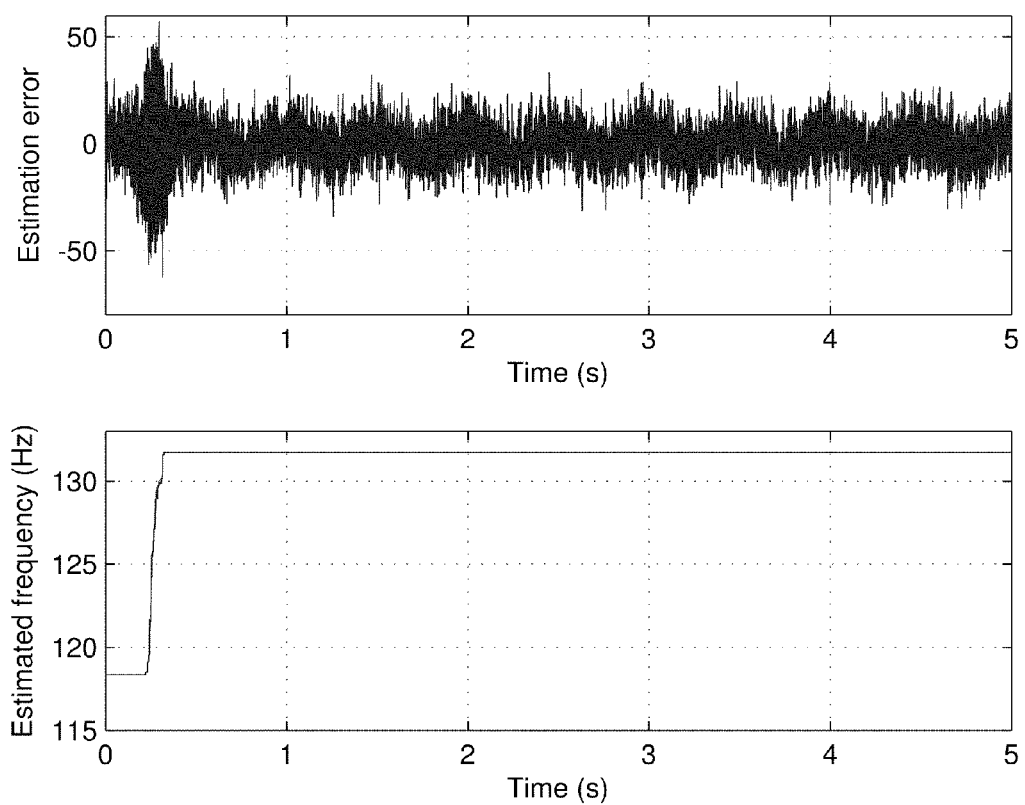
FIG. 11 illustrates simulation results for an adaptive scheme.

FIG. 11 illustrates simulation results for the adaptive scheme. The actual modal frequency may be 127.26 Hz. The top plot illustrates estimation error. The bottom plot illustrates estimated modal frequency.

Experiments

Experiments were conducted on the same day and run several times for further verification of the results.

Figure 12:
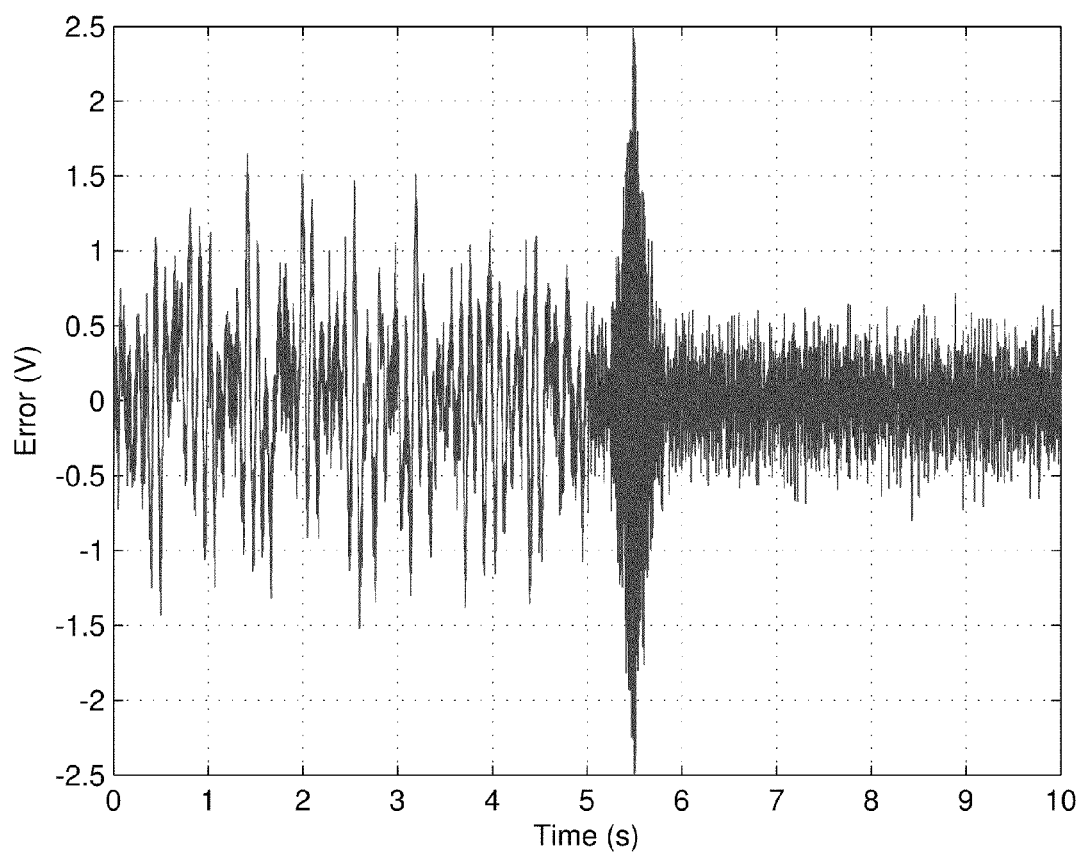
FIG. 12 illustrates a time series from an FSM experiment.

FIG. 12 illustrates a time series from the FSM experiment. The adaptive notch filter was initially placed at 95% of the actual modal frequency of the plant. However, the adaptive notch filter may update the center frequency online. The control loop was closed at 5 s.

In FIG. 12 the time series of the error signal when the adaptive scheme is run is displayed. For the first 5 s, the system may be open loop, so only the disturbance created by FSM-D is seen in the error signal. The initial estimate of the plant's modal frequency is assumed to be at 95% of the actual value, thereby placing the adaptive notch filter in the incorrect location. This variation could be due to environmental effects, variations between FSMs, or degradation over time. Since the notch filter center frequency is incorrect, the flexible mode is excited and creates a large error shortly after the loop is closed. Adaptation then occurs, the notch filter tracks the modal frequency, the flexible mode is suppressed, and the error signal attenuates.

As compared to a non-adaptive scheme, when the non-adaptive notch filter is placed perfectly (i.e., the plant model is correct and exactly known), the adaptive scheme may decrease the standard deviation of the error signal by 14%. This increase in performance may be due to the more aggressive rigid-body controller associated with the narrow adaptive notch filter.

Figure 13:
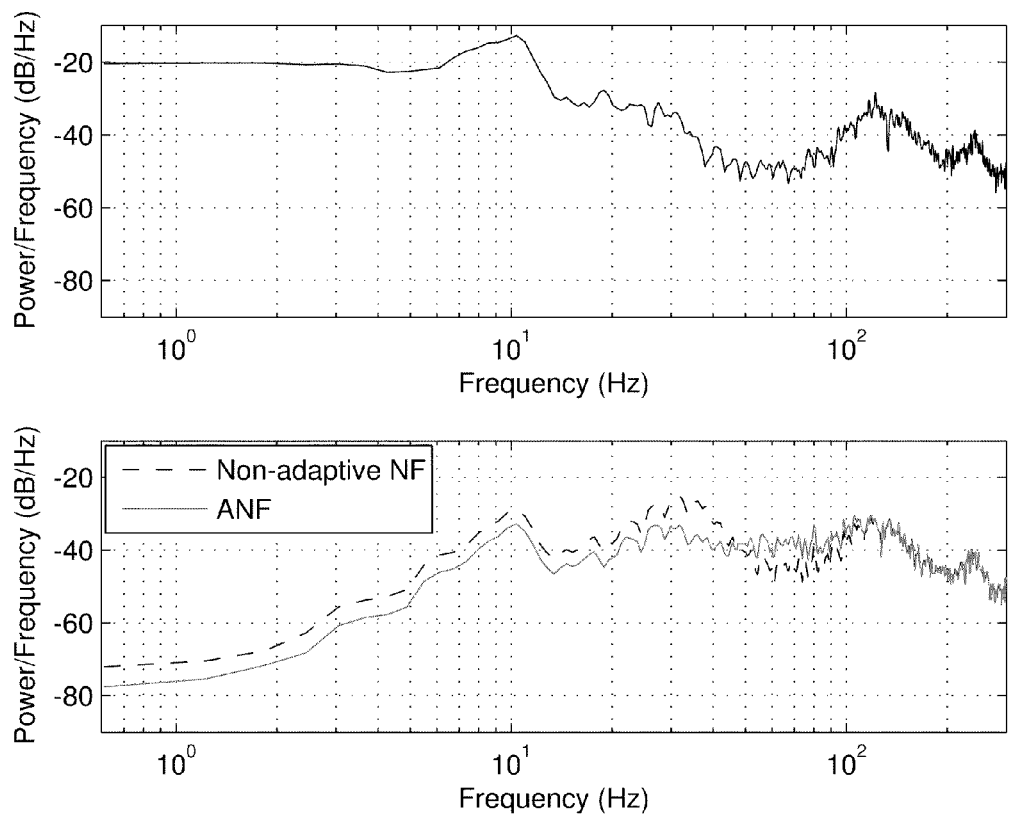
FIG. 13 illustrates PSDs computed from an error signal of an FSM experiment.

FIG. 13 illustrates PSDs computed from an error signal of an FSM experiment. The data used is collected from the 10 s mark until the 25 s mark. The top plot is the open-loop system, only disturbance. The bottom plot is a non-adaptive scheme and ANF.

The power spectral densities (PSDs) of error signal from the open loop system, adaptive scheme after adaptation, and non-adaptive scheme are presented in FIG. 13. The bottom plot displays the rejection of the disturbance with the adaptive scheme.

Figure 14:
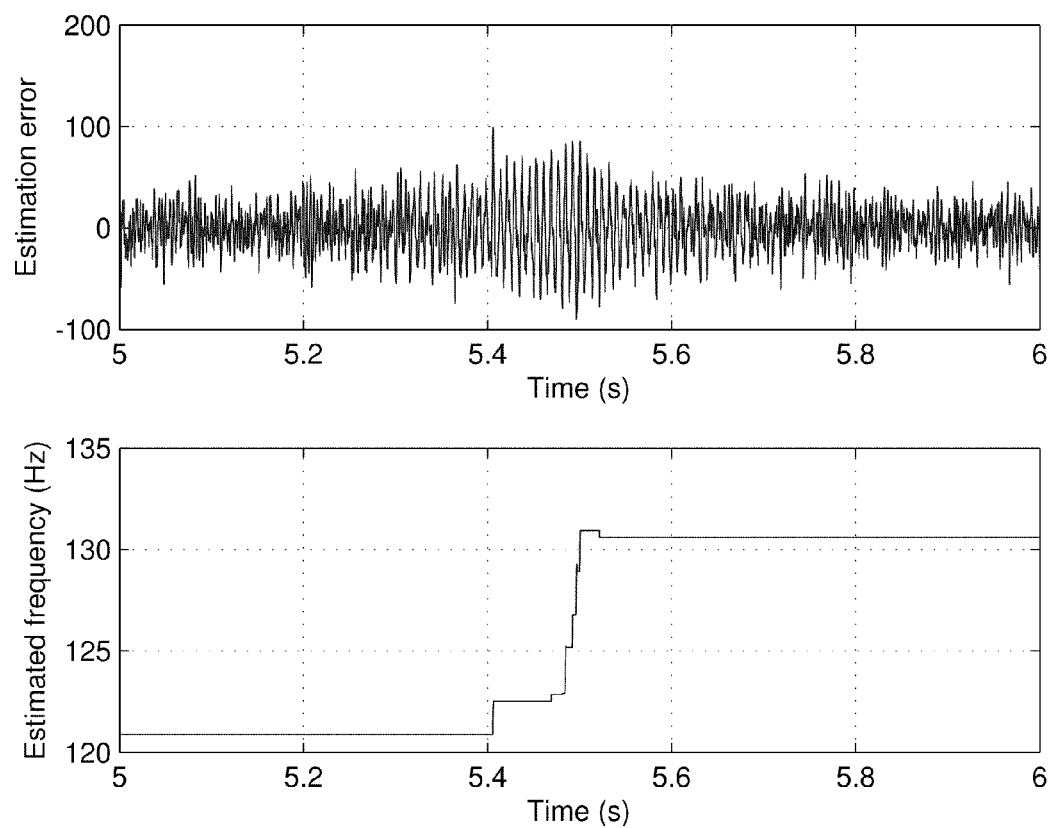
FIG. 14 illustrates data from an adaptive scheme when a loop is closed at 5 s.

FIG. 14 illustrates data from the adaptive scheme when the loop is closed at 5 s. The actual modal frequency is 127.26 Hz. The top plot illustrates estimation error. The bottom plot illustrates estimated modal frequency.

FIG. 14 shows the estimation error and estimated modal frequency for the adaptive scheme. The plots are time series which begin at 5 s into the experiment, which is the time at which the loop is closed and the adaptive control scheme is turned on. Initially the estimated modal frequency, and therefore notch center frequency, is incorrect. This causes the system to be unstable and the tracking error to grow large, which in turn causes the estimation error to grow larger than the disturbance level. This level of excitation is sufficient enough to cause the online estimator to begin adapting the parameters online. Once the level of the error decreases below the deadzone threshold, the estimation is halted and the parameters remain constant.

The estimated frequency may not exactly converge to the real plant modal frequency. But, this may be acceptable since the system becomes stable and the performance is improved. The adaptive mode suppression scheme does not guarantee that.

Figure 15:
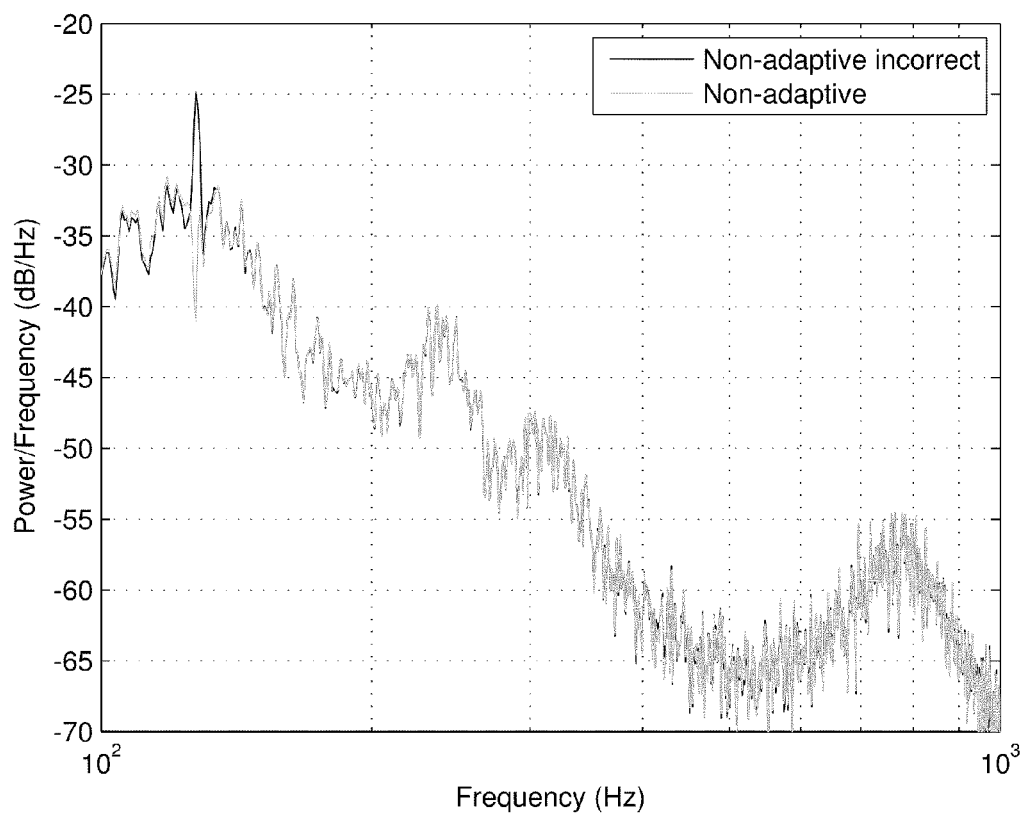
FIG. 15 illustrates PSDs computed from experimental data comparing a non-adaptive notch filter with an incorrect center frequency (97% of nominal) and one which is correct.

FIG. 15 illustrates PSDs computed from experimental data comparing a non-adaptive notch filter with an incorrect center frequency (97% of nominal) and one which is correct. Another case of the non-adaptive scheme is run, but this time the non-adaptive notch filter's center frequency is displaced. The center frequency is set at 97% of the plant mode frequency and the system remains stable, however the standard deviation of the tracking error is increased by 10%. This may be due to the lightly damped mode being excited by the control system which can be seen in FIG. 15. The plot shows the PSDs of the two cases, where the plant mode at 127 Hz can be seen as a spike in the plot due to the incorrectly placed non-adaptive notch filter.

These experimental results show that the adaptive scheme may be able to provide better performance than the non-adaptive version even when the non-adaptive notch filter is centered exactly on the flexible mode. With the center frequency slightly perturbed, the non-adaptive scheme remains stable. However, there may be a degradation in tracking error. The adaptive scheme can track and adjust for such an incorrect plant model, only after estimation error has sufficient information for adaptation to occur.

CONCLUSION

An adaptive mode suppression scheme has been described which incorporates an adaptive notch filter. An estimator using plant parameterization may be used to track the modal frequency of the flexible dynamics of the plant. This frequency estimate may then be used to update the center frequency of the adaptive notch filter. Since the adaptive notch filter may track the flexible mode, it can be designed narrower. This may allow for an increase in bandwidth of the closed loop system.

The adaptive scheme may be compared to a non-adaptive scheme empirically through the use of a laser beam pointing system. The experimental setup displays a plant with a lightly damped flexible mode near the desired closed loop bandwidth. Starting with incorrect parameters, the estimator of the adaptive scheme may be able to track the modal frequency of the plant in real-time and results in the adaptive notch filter being able to suppress the flexible mode. The benefit of the narrow adaptive notch filter may be seen in the improved tracking performance of the laser beam system. This experiment is but a single example of how the adaptive mode suppression scheme may be designed and implemented as a real-time control system.

The various control functions and equations which have been described may be implemented with embedded processors, digital signal processors (DSP), field-programmable gate arrays (FPGA), real-time computing software, and/or simulation software such as Matlab and Simulink.

The components, steps, features, objects, benefits and advantages which have been discussed are merely illustrative. None of them, nor the discussions relating to them, are intended to limit the scope of protection in any way. Numerous other embodiments are also contemplated. These include embodiments which have fewer, additional, and/or different components, steps, features, objects, benefits and advantages. These also include embodiments in which the components and/or steps are arranged and/or ordered differently.

For example, the adaptive notch filter and online estimator may be implemented without a rigid body controller. Also, the adaptive notch filter may be used to substantially suppress the modal frequency from the feedback signal which is the output of a plant, rather than the control signal which is the input to the plant.

A feedback system with an adaptive notch filter can identify on line the effects of the flexible modes and neutralize them without having to use probing signals and persistence of excitation assumptions. It may do so by forcing a certain gain associated with the adaptive notch filter to stay close to one which may be a sufficient condition for stability and performance. In such case, the estimated parameters may converge to a plane, rather than a point. If it happens that the persistence of excitation condition is satisfied, then the plane may collapse to a point in space. This may guarantees parameter convergence.

The adaptive notch filter can be applied to an arbitrary number of flexible modes by using the same approach and methodology. In this instance, the adaptive notch filter might have a separate adaptive notch for each flexible mode.

Unless otherwise stated, all measurements, values, ratings, positions, magnitudes, sizes, and other specifications which are set forth in this specification, including in the claims which follow, are approximate, not exact. They are intended to have a reasonable range which is consistent with the functions to which they relate and with what is customary in the art to which they pertain.

All articles, patents, patent applications, and other publications which have been cited in this disclosure are hereby incorporated herein by reference.

The phrase "means for" when used in a claim is intended to and should be interpreted to embrace the corresponding structures and materials which have been described and their equivalents. Similarly, the phrase "step for" when used in a claim is intended to and should be interpreted to embrace the corresponding acts which have been described and their equivalents. The absence of these phrases in a claim mean that the claim is not intended to and should not be interpreted to be limited to any of the corresponding structures, materials, or acts or to their equivalents.

Nothing which has been stated or illustrated is intended or should be interpreted to cause a dedication of any component, step, feature, object, benefit, advantage, or equivalent to the public, regardless of whether it is recited in the claims.

The scope of protection is limited solely by the claims which now follow. That scope is intended and should be interpreted to be as broad as is consistent with the ordinary meaning of the language which is used in the claims when interpreted in light of this specification and the prosecution history which follows and to encompass all structural and functional equivalents.

The invention claimed is:

1. A subsystem in a feedback control system for a plant having a flexible mode with a modal frequency that is driven by a control signal, the subsystem comprising:
   an adaptive notch filter configured to substantially suppress the modal frequency from the control signal, the adaptive notch filter being configured such that its notch frequency is governed by a tuning signal; and
   an online estimator configured to estimate the modal frequency of the flexible mode in the plant in real time based on the dynamic response of the plant to the control signal and to generate the tuning signal based on the estimate of the modal frequency.

2. The subsystem of claim 1 further comprising a rigid body controller configured to generate a control signal that would tightly control the plant if the plant did not have the flexible mode at the modal frequency.

3. The subsystem of claim 1 wherein the adaptive notch filter has a bandwidth which is less than 125 percent of the bandwidth of the inverse of the flexible mode of the plant.

4. The subsystem of claim 1 wherein the configuration of the online estimator does not generate a substantially erroneous estimate of the modal frequency, even in response to a disturbance at a magnitude which causes the feedback control system to become unstable.

5. The subsystem of claim 1 wherein the adaptive notch filter and the online estimator are contained within a single integrated chip.

6. The subsystem of claim 1 wherein the tuning signal is not based on the results of a probe signal injected into the plant, separate from the control signal.

7. The subsystem of claim 1 wherein the online estimator is configured to repeatedly update the determined modal frequency of the flexible mode in the plant based on the dynamic response of the plant to the control signal.

8. The subsystem of claim 7 wherein the online estimator is configured to repeatedly update the tuning signal based on the repeated updated determined modal frequency of the flexible mode in the plant.

9. A signal-controlled plant comprising:
   a plant having a flexible mode with a modal frequency;
   a feedback control system for the plant that is driven by a control signal, the feedback control system comprising:
      an adaptive notch filter configured to substantially suppress the modal frequency from the control signal, the adaptive notch filter being configured such that its notch frequency is governed by a tuning signal; and
      an online estimator configured to estimate the modal frequency of the flexible mode in the plant in real time based on the dynamic response of the plant to the control signal tuning signal and to generate the tuning signal based on the estimate of the modal frequency.

10. The controlled plant of claim 9 further comprising a rigid body controller configured to generate a control signal that would tightly control the plant if the plant did not have the flexible mode at the modal frequency.

11. The controlled plant of claim 9 wherein the adaptive notch filter has a bandwidth which is less than 125 percent of the bandwidth of the inverse of the flexible mode of the plant.

12. The controlled plant of claim 9 wherein the online estimator is configured not to generate a substantially erroneous estimate of the modal frequency, even in response to a disturbance at a magnitude which causes the feedback control system to become unstable.

13. The controlled plant of claim 9 wherein the adaptive notch filter and the online estimator are contained within a single integrated chip.

14. The controlled plant of claim 9 wherein the tuning signal is not based on the results of a probe signal injected into the plant, separate from the control signal.

15. The controlled plant of claim 7 wherein the online estimator is configured to repeatedly update the determined modal frequency of the flexible mode in the plant based on the dynamic response of the plant to the control signal.

16. The subsystem of claim 15 wherein the online estimator is configured to repeatedly update the tuning signal based on the repeated updated determined modal frequency of the flexible mode in the plant.

17. The controlled plant of claim 9 wherein the plant is a hard disk drive.

18. The controlled plant of claim 9 wherein the plant is an aircraft.

19. The controlled plant of claim 9 wherein the plant is a launch vehicle.

20. The controlled plant of claim 9 wherein the plant is a camera.

* * * * *